US 6,587,892 B2

(12) United States Patent
Casper (10) Patent No.: US 6,587,892 B2
(45) Date of Patent: Jul. 1, 2003

(54) METHOD OF REDUCING DATA COMMUNICATION TIME

(75) Inventor: Stephen L. Casper, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/767,186

(22) Filed: Jan. 22, 2001

(65) Prior Publication Data

US 2001/0005049 A1 Jun. 28, 2001

Related U.S. Application Data

(62) Division of application No. 09/067,359, filed on Apr. 27, 1998, now Pat. No. 6,184,067, which is a continuation of application No. 08/660,109, filed on Jun. 7, 1996, now Pat. No. 5,744,870.

(51) Int. Cl.[7] .......................... G06F 13/00; G06F 13/14; G06F 13/38
(52) U.S. Cl. .................. 710/2; 710/33; 710/36; 710/51; 711/169; 438/107; 257/358; 326/39
(58) Field of Search ................. 710/33, 2, 36, 710/51; 711/169; 326/39; 257/358; 438/107

(56) References Cited

U.S. PATENT DOCUMENTS

| | | | | | |
|---|---|---|---|---|---|
| 5,233,603 | A | * | 8/1993 | Takeuchi et al. | 370/412 |
| 5,373,470 | A | * | 12/1994 | Jones, Jr. | 365/189.05 |
| 5,808,343 | A | * | 9/1998 | Pilling et al. | 257/358 |
| 5,847,578 | A | * | 12/1998 | Noakes et al. | 326/39 |
| 5,946,552 | A | * | 8/1999 | Bird et al. | 438/107 |
| 6,009,481 | A | * | 12/1999 | Mayer | 710/33 |
| 6,178,488 | B1 | * | 1/2001 | Manning | 711/169 |

* cited by examiner

Primary Examiner—Jeffrey Gaffin
Assistant Examiner—Rehana Perveen
(74) Attorney, Agent, or Firm—Schwegman, Lundberg, Woessner & Kluth, P.A.

(57) ABSTRACT

A memory device is described which is fabricated as an integrated circuit and uses distributed bond pads for electrical connection to an external conductive lead. The distributed bond pads are attached to a external lead, thereby eliminating bus lines on the integrated circuit memory. Distributed buffer circuits are described which can be included with the distributed bond pads to increase data communication time between the memory device and an external processor.

26 Claims, 5 Drawing Sheets

METHOD OF REDUCING DATA COMMUNICATION TIME

This application is a Divisional of U.S. Ser. No. 09/067,359 filed Apr. 27, 1998 now U.S. Pat. No. 6,184,067 which is a continuation of U.S. Ser. No. 08/660,109 filed on Jun. 7, 1996 now issued as U.S. Pat. No. 5,744,870 on Apr. 28, 1998.

TECHNICAL FIELD OF THE INVENTION

The present invention relates generally to memory devices and in particular the present invention relates to integrated circuit memory devices having multiple data communication connections.

BACKGROUND OF THE INVENTION

Packaged integrated circuit memory devices typically include a semiconductor die or chip which is encapsulated in plastic. The integrated circuit chip is connected to a printed circuit board through electrical conductors called leads. During manufacturing, all leads are typically connected together in what is referred to as a lead frame. The lead frame is electrically attached to the die using thin wire, typically made of gold, which is bonded to both the lead frame and bond pads provided on the chip surface. The chip and a portion of the lead frame is then encapsulated in plastic and the interconnections of the various conductors of the lead frame are removed to leave independent, electrically isolated leads.

It is known to those skilled in the art that multiple bond pads or multiple bond wires can be used to attach power and ground leads to an integrated circuit. These arrangements can be used to simplify power distribution throughout the integrated circuit. In contrast, only one bond pad is provided for each data lead of the memory device. Thus, multiple lengthy conductors are provided on the die if several circuits located remotely on the die must be connected to a common lead. These conductors reduce the operating efficiency of the memory and require available real estate. Further, data communication connections (DQ's) use a single input/output buffer circuit in conjunction with each bond pad to which the multiple conductors are connected. The single buffer and the long conductors in combination increase the complexity of the die and reduce the operating time efficiency of the memory device.

For the reasons stated above, and for other reasons stated below which will become apparent to those skilled in the art upon reading and understanding the present specification, there is a need in the art for a memory device which eliminates the need for data communication paths on an integrated circuit die from multiple remote circuits to a common data buffer and bond pad.

SUMMARY OF THE INVENTION

The above-mentioned problems with integrated circuit memories and other problems are addressed by the present invention and which will be understood by reading and studying the following specification. A memory device is described which uses distributed input/output buffers and multiple bond pads for data communication connections.

In particular, the present invention describes an integrated circuit memory device comprising an integrated memory die having multiple bond attachment pads, and a conductive leads connected to the bond attachment pads such that some of the conductive leads are connected to more than one bond attachment pad.

In another embodiment a memory device is described which comprises a plurality of conductive leads, and an integrated circuit memory chip. The memory chip comprises an array of memory cells arranged in subarrays, bond pads fabricated on the integrated circuit memory chip and electrically coupled to the subarrays, the bond pads are electrically connected to the conductive leads such that the bond pads are connected to one of the conductive leads.

A method of reducing data communication time in an integrated memory circuit is described. The method comprises the steps of fabricating an integrated memory circuit on a semiconductor die having bi-directional data communication circuits coupled to a plurality bond pads distributed over the die, providing a lead frame having an electrically conductive lead for bonding to the distributed bond pads, and bonding the bond pads to the electrically conductive lead for bi-directional data communication with an external processor.

In yet another embodiment, a bi-directional data communication system is described. The system comprises a processing unit, and a memory device connected to the processing unit through data communication connections. The data communication connections comprise electrically conductive leads. The memory device is fabricated as a semiconductor die and comprises an array of memory cells arranged in a plurality of subarrays, a plurality of bond pads fabricated on the integrated circuit memory chip and electrically coupled to the plurality of subarrays. The plurality of bond pads are electrically connected to the plurality of conductive leads such that a plurality of bond pads are connected to each one of the plurality of conductive leads.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
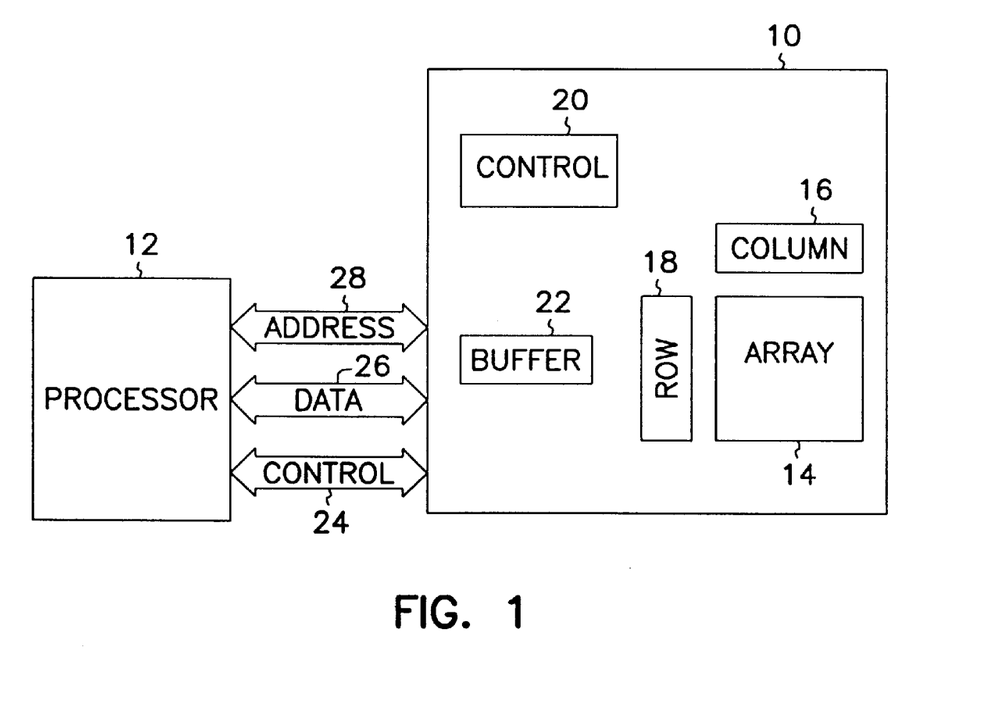
FIG. 1 is a diagram of a block diagram of a DRAM incorporating the present invention.

FIG. 1 illustrates a simplified block diagram of a DRAM 10. The memory device can be coupled to a processor 12 such as a microprocessor of a personal computer. The memory device 10 includes a memory array 14 having rows and columns of memory cells. Column decoder 16 and row decoder 18 are provided to access the memory array in response to address signals provided by the processor 12 on address communication lines 28. Data communication is conducted via I/O buffer circuitry 22 and bi-directional data communication lines 26 (DQ). Internal control circuitry 20 accesses the memory array in response to commands provided by the processor 12 on control lines 24. The control lines can include Row Address strobe (RAS*), Column Address Strobe (CAS*), Write Enable (WE*), and Output Enable (OE*). It will be appreciated by those skilled in the art that the present invention is equally applicable to other types of memory devices including, but not limited to, SRAM, SDRAM, EDO, Burst EDO, and VRAM.

Figure 2:
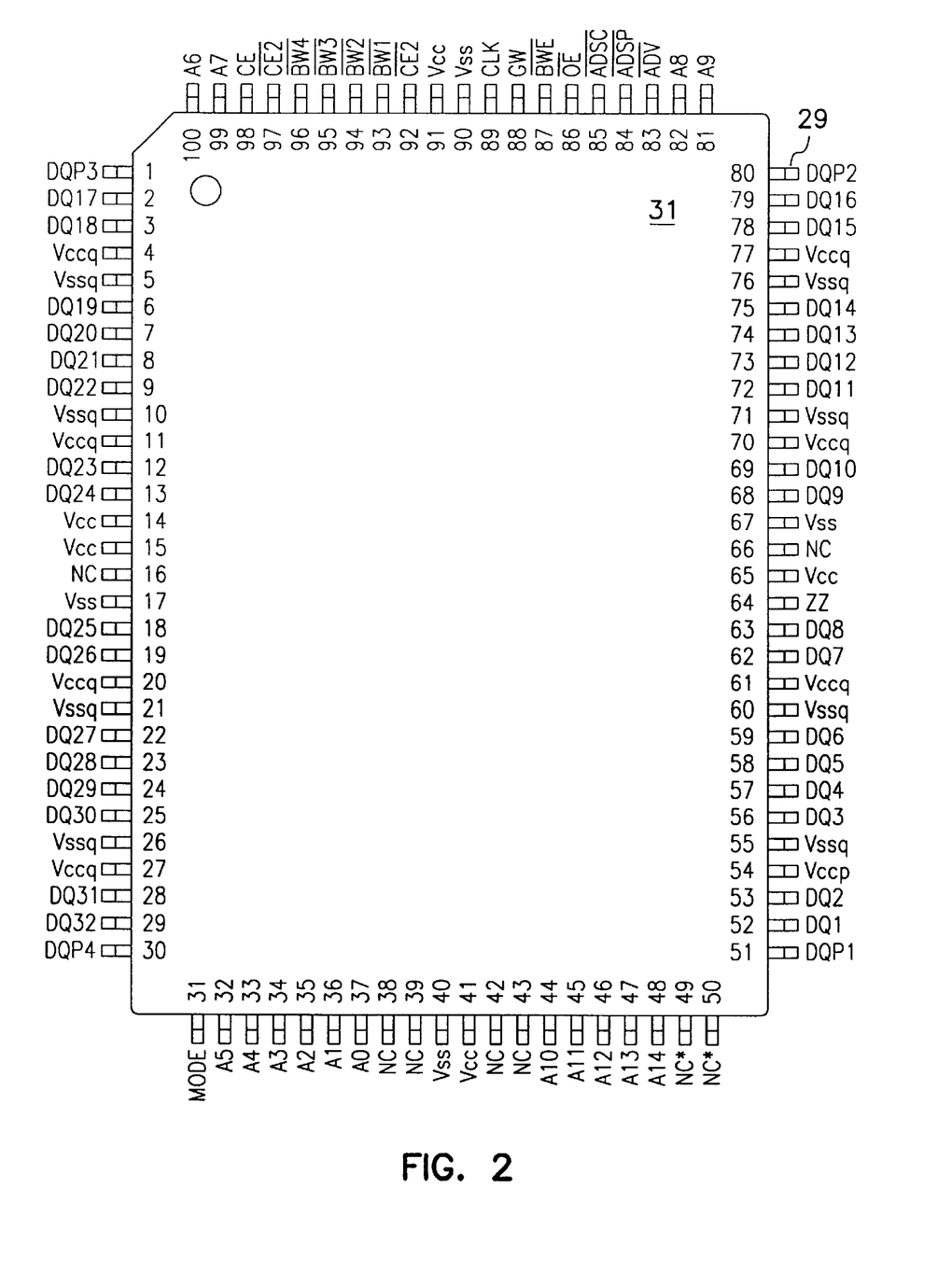
FIG. 2 is a diagram of a packaged SRAM memory.

FIG. 2 shows a top view of an integrated circuit package of a 32 k by 36 SRAM circuit memory device. The packaged memory has metal leads 29 (pins) provided for external connections. The metal connections are typically fabricated as a lead frame which is electrically bonded to the integrated circuit. The lead frame and memory circuit is enclosed to protect the circuit and bond connections from environmental contaminates. As stated above, plastic is a preferred material for use in enclosing the memory device.

Figure 3:
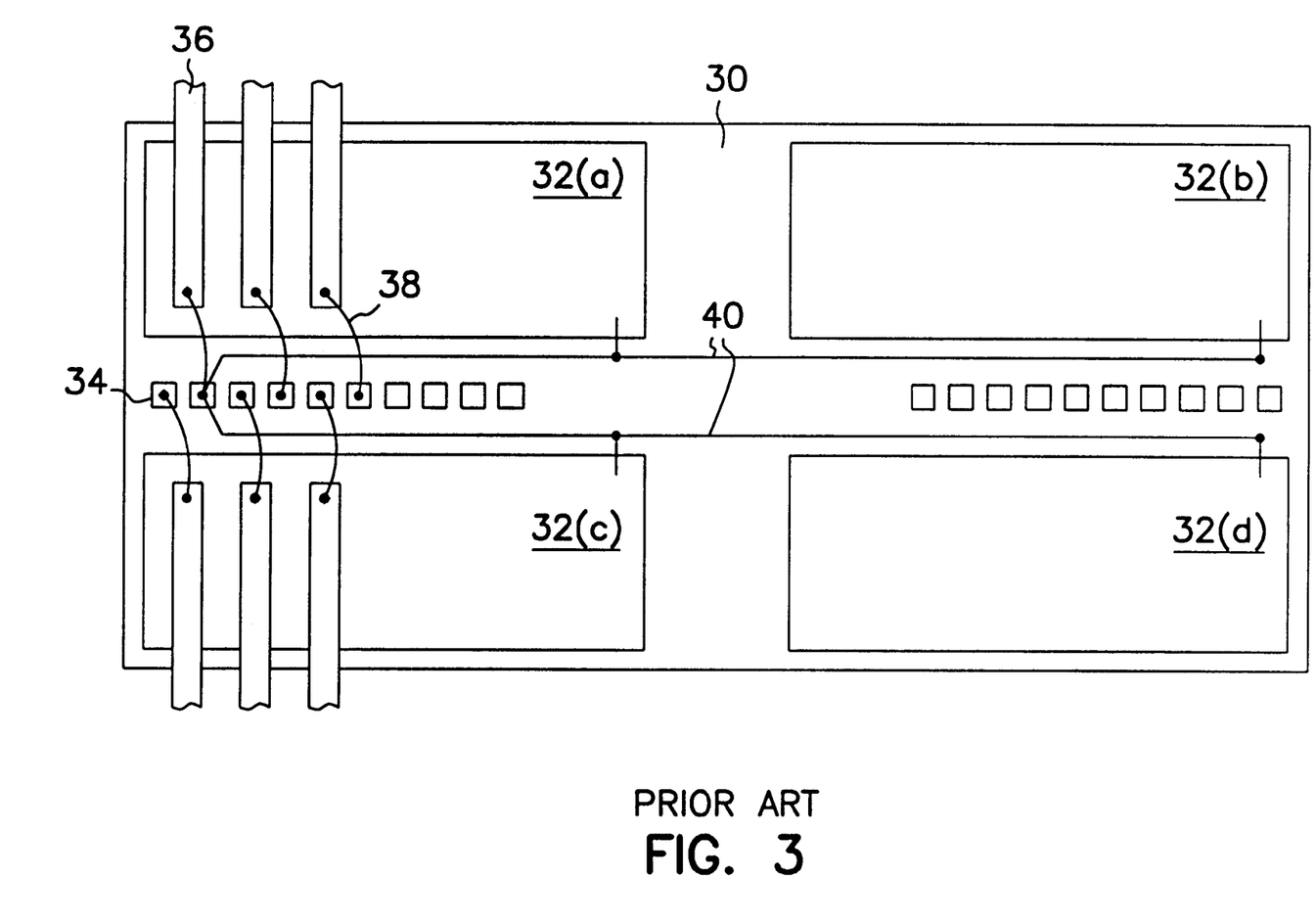
FIG. 3 is a diagram of a prior art memory chip and lead frame.

FIG. 3 illustrates an integrated circuit memory die attached to a lead frame. The lead frame is only partially illustrated to show some of the lead frame connections used to bond to the integrated circuit die. It will be appreciated that any number of lead frame connections can be used for a memory circuit and are limited only by the physical constraints of the memory package. The lead frame 36 is connected to the memory die 30 through bond wires 38 which are attached to bond pads 34 provided on the die. The memory die is fabricated with a memory array divided into four array subsections 32(a)–(d). Each subsection is connected to each data pin (DQ).

When multiple circuit locations need to be attached to one lead frame connection, a conductive path is fabricated on the die. This path is preferably a layer of metal deposited on the die, however, polysilicon can be used. Because the memory cells are arranged in an array covering a substantial portion of the die, data communication between the external controller and the memory device is typically performed via data bus paths 40. The data bus paths are susceptible to parasitic capacitance which can significantly increase time delays experienced in data communication. Input/Output buffer circuits are typically provided for each data communication bond pad. The data bus paths, therefore, are routed through the buffer circuitry.

Distributed Bond Pads and I/O Buffers

Figure 4:
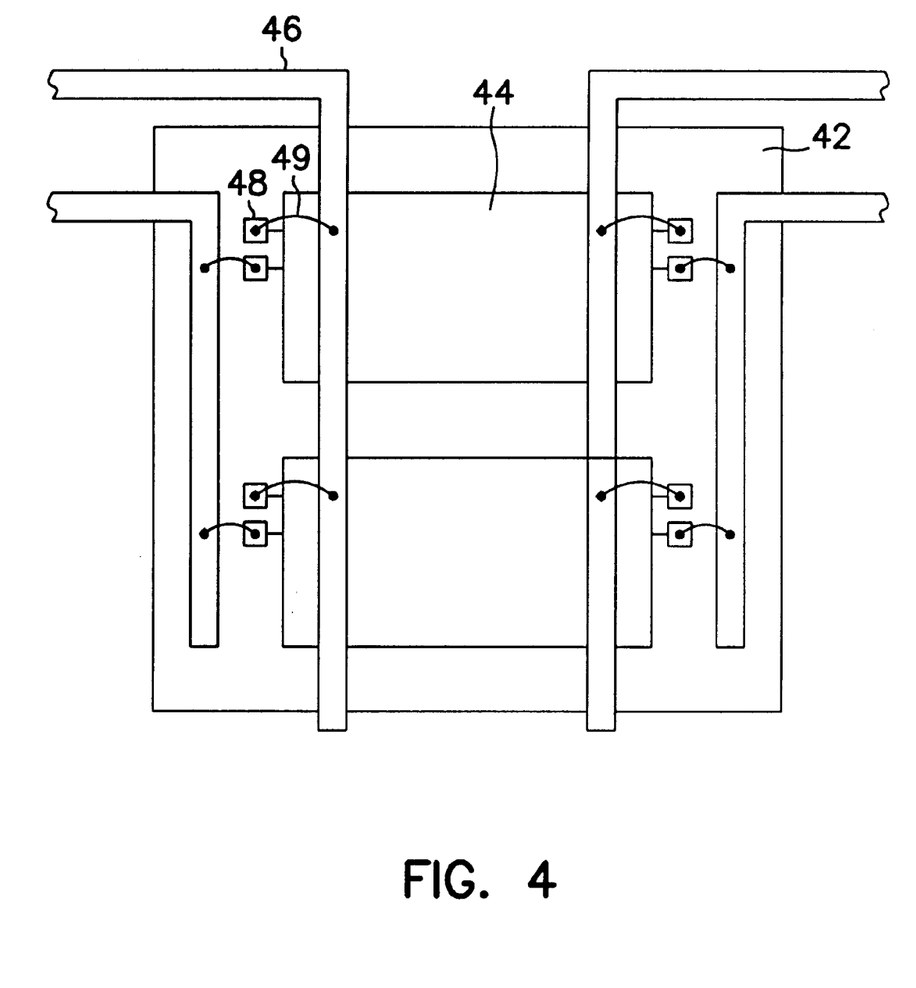
FIG. 4 is a diagram of a memory chip and lead frame of the present invention.

FIG. 4 illustrates a memory device which uses distributed data bond pads to reduce time delays in data communication. Further, the complexity and die size of the integrated circuit is reduced. The memory device can be a dynamic random access memory (DRAM), a static RAM, or any other type of memory device. The memory device eliminates the need for data bus paths by using extended lead connections which traverse the integrated circuit die to receive multiple bond wires. This structure increases data communication speed between the memory array and the external processor by reducing the parasitic capacitance in the data path. It will be recognized that multiple bond pads can be provided for all data communication lines (DQ's) or provided for select DQ lines which are determined to be most susceptible to delays.

The integrated memory die 42 is fabricated with a memory cell array divided into sub-array sections 44. Bond pads 48 are provided adjacent the sub-arrays for connection to the lead frame legs 46. The lead frame legs are bonded to multiple bond pads for electrical communication with the memory die. The data bus lines 40 of FIG. 3 are eliminated by using the extended leads and multiple bond pads. It will be appreciated by those skilled in the art that input/output buffer circuitry will be included for each bond pad. Thus, additional circuitry is needed for the distributed bond pad memory device. The additional real estate needed for the buffer circuitry, however, is more than offset by the reduction of bus lines.

Figure 5:
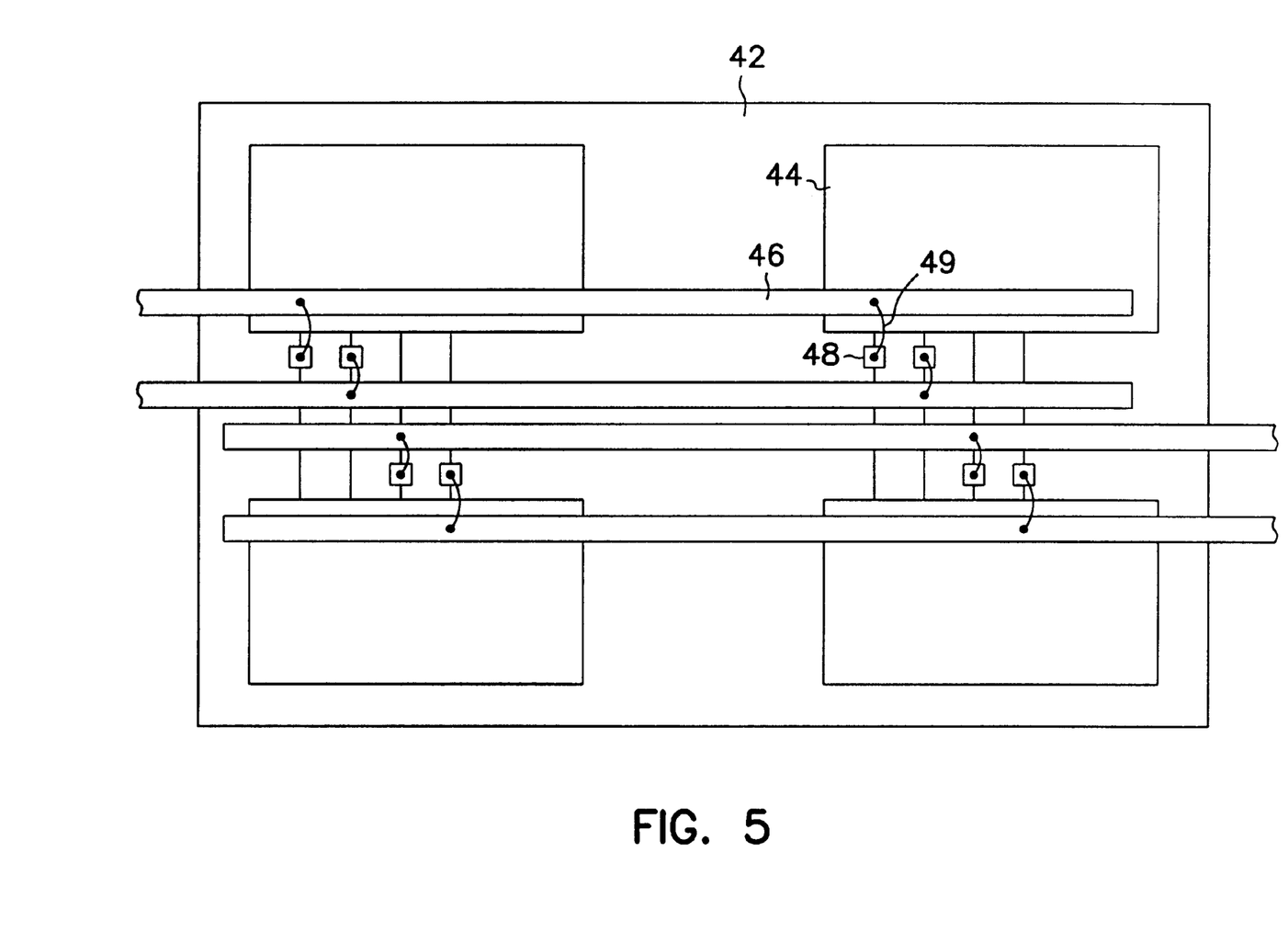
FIG. 5 is a diagram of an alternate embodiment of a memory chip and lead frame of the present invention.

Partial data bus paths can be used with multiple bond pads to reduce the parasitic capacitance experienced in the memory of FIG. 3, as illustrated in FIG. 5. Some of the sub-arrays of the memory die share a common bond pad and buffer circuitry. The data bus lines are, however, substantially reduced by using multiple bond pads per lead frame connector.

The lead frames of FIGS. 4 and 5 are intended to illustrate different types of lead frames which can be used with a distributed system. It will be appreciated by those skilled in the art that the actual layout and dimensions of a lead frame will depend upon the integrated circuit die size and layout and the desired package pin out. Further, the distributed bond pads of the present invention can be readily used with flip-chip technology. As known to those skilled in the art, packaging an integrated circuit using flip-chip technology involves the use of solder bumps placed on the die bond pads which are then bonded to a circuit board. Thus, the integrated circuit is "flipped" over during the packaging process and the data communication bond pads are connected to conductive leads formed on the circuit board. Substituting a circuit board using flip-chip techniques, or other known packaging processes, in place of a lead frame can simplify the packaging of some complicated memory circuits.

Conclusion

A memory device has been described which uses an integrated circuit die having multiple distributed bond pads associated with one external data connection. A lead frame and multiple bond connections are used to electrically connect the distributed bond pads, thereby eliminating the need for lengthy data communication buses fabricated on the die. Distributed buffer circuits can be included in the memory for data communication between the memory circuit and the distributed bond pads. The integrated circuit memories, therefore, have a reduced die size which is less complex. Further, the data communication speed of the memory is increased.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operating an integrated circuit comprising:

receiving a data input on a single data input pin;

receiving the data input signal on two data bond pads which are electrically coupled to the single data input pin;

processing the data input signal using internal circuitry in response to the two data bond pads;

generating a plurality of output signals; and coupling the plurality of output signals to a single data output pin via at least two data bond pads electrically connected to the single data output pin.

2. A method of operating an integrated circuit comprising:
receiving a data input signal on a single input pin;
distributing the data input signal to a plurality of distributed bond pads electrically connected to the single input pin;
processing the data input signal using internal circuitry which is coupled to the plurality of distributed bond pads;
generating at least one output signal; and
coupling the at least one output signal to a single output pin via the plurality of distributed bond pads.

3. The method of claim 1, wherein receiving the data input signal on two data bond pads which are electrically coupled to the single data input pin includes receiving the data input signal on two data bond pads through wire bonding that couples each of the two data bond pads to the single data input pin.

4. A method of operating an integrated circuit comprising:
receiving a data input signal on a single input pin;
distributing the data input signal to a plurality of distributed bond pads electrically connected to the single input pin; and
processing the data input signal using internal circuitry which is coupled to the plurality of distributed bond pads.

5. The method of claim 2, wherein coupling the at least one output signal to a single output pin via the plurality of distributed bond pads comprises coupling the at least one output signal to a single output pin through wire bonding that connects the plurality of bond pads to the single output pin.

6. A method of operating an integrated circuit comprising:
generating a plurality of output signals;
providing each of the output signals to separate data bond pads of a plurality of distributed data bond pads; and
coupling at least two of the plurality of output signals to a single data output pin via at least two data bond pads of the plurality of distributed data bond pads, wherein the at least two data bond pads are electrically connected to the single data output pin.

7. The method of claim 6, wherein coupling at least two of the plurality of output signals to a single data output pin via at least two data bond pads includes coupling the at least two of the plurality of output signals to a single data output pin via the at least two data bond pads through wire bonding that connects the at least two data bond pads of the plurality of data bond pads to an electrically conductive lead which is bonded to the single data output pin.

8. The method of claim 4, wherein distributing the data input signal to a plurality of distributed bond pads electrically connected to the single input pin includes distributing the data input signal to a plurality of distributed bond pads through wire bonding that couples each of the plurality of bond pads to the single input pin.

9. The method of claim 4 wherein distributing the data input signal to a plurality of distributed bond pads electrically connected to the single input pin includes distributing the data input signal to a plurality of distributed bond pads through solder bumps that couple each of the plurality of bond pads to the single input pin.

10. The method of claim 6, wherein coupling at least two of the plurality of output signals to a single data output pin via at least two data bond pads includes coupling the at least two of the plurality of output signals to a single data output pin via the at least two data bond pads through solder bumps that connect the at least two data bond pads of the plurality of data bond pads to an electrically conductive lead that is bonded to the single data output pin.

11. A method of operating an integrated circuit comprising:
receiving a data input signal on a single lead frame for distribution to sub-arrays of a memory cell array;
distributing the data input signal to two bond pads of a plurality of distributed bond pads through bonded connections to the single lead frame, each of the two bond pads adjacent a different sub-array; and
processing the data input signal at each bond pad using internal circuitry at each bond pad.

12. The method of claim 11, wherein processing the data input signal at each bond pad using internal circuitry at each bond pad includes processing the data input signal at each bond pad using input buffer circuitry at each bond pad.

13. The method of claim 11, wherein receiving a data input signal on a single lead frame for distribution to sub-arrays of a memory cell array includes receiving a data input signal for a data communication line of a memory.

14. The method of claim 11, wherein distributing the data input signal to two bond pads of a plurality of distributed bond pads includes directing the data input signal by the signal lead frame traversing a die on which the integrated circuit is formed.

15. A method of operating an integrated circuit comprising:
accessing a first memory cell in a first sub-array of an array of memory cells;
processing data from the first memory cell through a first output buffer circuit at a first bond pad adjacent the first sub-array;
coupling the data from the first bond pad bonded to a lead frame for output to an external processor;
accessing a second memory cell in a second sub-array of the array of memory cells;
processing data from the second memory cell through a second output buffer circuit at a second bond pad adjacent the second sub-array; and
coupling the data from the second bond pad bonded to the lead frame for output to the external processor.

16. The method of claim 15, wherein accessing a first memory cell in a first sub-array of an array of memory cells includes accessing a first memory cell in a dynamic random access memory.

17. The method of claim 15, wherein coupling the data from the first bond pad bonded to a lead frame for output to an external processor includes coupling the data from the first bond pad through solder bumps connecting the first bond pad to the a lead frame.

18. The method of claim 15, wherein coupling the data from the second bond pad bonded to the lead frame for output to the external processor includes outputting the data from the second bond pad by the signal lead frame traversing a die on which the integrated circuit is formed.

19. A method of operating an integrated circuit comprising:
receiving data signals at a plurality of input pins, each input pin bonded to a separate extended lead frame traversing at least a portion of a semiconductor die on which a memory is formed, each extended lead frame bonded to a number of distributed bond pads, each bond pad adjacent a separate sub-array of memory cells of the memory;

providing the received data signals directly to the distributed bond pads from the plurality of input pins;

processing the received data signals at each distributed bond pad using internal circuitry coupled at each distributed bond pad; and storing data in the memory representative of the received data signals.

20. The method of claim 19, wherein storing data in the memory representative of the received data signals includes storing data in a dynamic radon access memory.

21. The method of claim 19, wherein providing the received data signals directly to the distributed bond pads from the plurality of input pins includes providing the received data signals directly to the distributed bond pads through wire bonds from each lead frame.

22. The method of claim 19 wherein providing the received data signals directly to the distributed bond pads from the plurality of input pins includes providing the received data signals directly to the distributed bond pads through solder bumps to each lead frame.

23. A method of operating an integrated circuit comprising:

communicating data bi-directionally with the integrated circuit; and processing data through buffered input/output circuits coupling sub-arrays of memory cells within the integrated circuit to a plurality of data communication bond pads distributed adjacent each sub-array, wherein a data communication bond pad adjacent each sub-array is bonded to a common lead frame.

24. The method of claim 23, wherein communicating data bi-directionally with the integrated circuit includes bi-directional transmission of data signals on a system data bus from a processor.

25. The method of claim 23, wherein communicating data bi-directionally with the integrated circuit includes communicating with a static random access memory.

26. The method of claim 23, wherein processing data through buffered input/output circuits includes providing the processed data to the common lead frame through wire bonding between a distributed bond pad and the common lead.

* * * * *

UNITED STATES PATENT AND TRADEMARK OFFICE
CERTIFICATE OF CORRECTION

PATENT NO. : 6,587,892 B2 Page 1 of 1
DATED : July 1, 2003
INVENTOR(S) : Stephen L. Casper It is certified that error appears in the above-identified patent and that said Letters Patent is hereby corrected as shown below:

Title page,
Item [56], References Cited, U.S. PATENT DOCUMENTS, insert the following:

| | | | |
|---|---|---|---|
| -- 4,733,288 | 3/1988 | Sato ............................. | 357/40 |
| 4,930,000 | 5/1990 | Kantz ............................ | 357/68 |
| 4,945,395 | 7/1990 | Suehiro .......................... | 357/40 |
| 5,066,999 | 11/1991 | Casper ........................... | 357/51 |
| 5,073,816 | 12/1991 | Wakefield et al. ................. | 357/74 |
| 5,208,782 | 5/1993 | Sakuta, et al. ..................... | 365/230.03 |
| 5,233,220 | 8/1993 | Lamson, et al. .................... | 257/666 -- |

Under "5,233,603 A * 8/1993 Takeuchi et al. ................... 370/412" insert the following: -- 5,359,224 10/1994 Heinen et al. ............ 257/666 --; and under "5,373,470 A * 12/1994 Jones, Jr. ............ 365/189.05"; insert the following:
-- 5,587,607 12/1996 Yasuda et al. ..................... 257/690
 5,627,792 5/1997 Tsujimoto ....................... 365/230.03 --

Column 6,
Line 53, delete "a" before "lead".

Column 7,
Line 10, delete "radon" and insert -- random -- therefor.
Line 16, insert -- , -- after "claim 19".

Signed and Sealed this

Twenty-third Day of December, 2003

JAMES E. ROGAN
*Director of the United States Patent and Trademark Office*